(12) United States Patent
Lin

(10) Patent No.: US 7,133,484 B2
(45) Date of Patent: Nov. 7, 2006

(54) HIGH-FREQUENCY CLOCK GENERATOR WITH LOW POWER CONSUMPTION

(75) Inventor: Hsiao-Chyl Lin, Taipei (TW)

(73) Assignee: VIA Technologies, Inc., Taipei (TW)

( * ) Notice: Subject to any disclaimer, the term of this patent is extended or adjusted under 35 U.S.C. 154(b) by 975 days.

(21) Appl. No.: 10/131,739

(22) Filed: Apr. 23, 2002

(65) Prior Publication Data

US 2003/0021369 A1      Jan. 30, 2003

(30) Foreign Application Priority Data

Jul. 24, 2001    (TW) ............................. 90118096 A

(51) Int. Cl.
   *H03D 3/24*    (2006.01)
(52) U.S. Cl. .................. 375/373; 327/119; 327/122
(58) Field of Classification Search ............... 375/371, 375/373, 378; 372/116, 119, 120, 122
   See application file for complete search history.

(56) References Cited

U.S. PATENT DOCUMENTS 6,008,676 A * 12/1999 Lee et al. ................... 327/122
6,388,492 B1 * 5/2002 Miura et al. ................ 327/291

* cited by examiner

*Primary Examiner*—Kevin Kim

(57) ABSTRACT

A high-frequency clock generator with low power consumption is made up of a single phase-locked loop and a serially-connected sampling circuit coupled thereto. The phase-locked loop includes a voltage-controlled oscillator which is configured to provide multiple low-frequency oscillating clock signals each of which has the same frequency but with different phases. The sampling circuit includes at least one stage of sampler, and each stage of sampler includes at least one sampling unit. The sampling circuit samples the low-frequency oscillating clock signals with different phase, in order to generate a clock signal with a frequency being $2^n$ times as the frequency of the low-frequency oscillating clock signals generated by the phase-locked loop, and where n is the number of stages of the sampler in the sampling circuit.

15 Claims, 6 Drawing Sheets

HIGH-FREQUENCY CLOCK GENERATOR WITH LOW POWER CONSUMPTION

FIELD OF THE INVENTION

The present invention is generally in relation to a clock generator. In particular, the present invention is in relation to a high-frequency clock generator capable of generating an output clock signal of a frequency being $2^n$ times as the input clock frequency under the condition of low power consumption.

BACKGROUND OF THE INVENTION

For a variety of integrated circuit devices, a clock generator is indispensable for providing clock signals to actuate the operation of an integrated circuit devices. For some integrated circuits (or ICs) involved in specific technical applications, for example, the Gigabit Ethernet Serdes IC, a high-frequency clock generator is essential to the IC for providing high-frequency clock signals to drive the IC to work at a high frequency.

Referring to FIG. 1, a feasible high-frequency clock generator of the prior art is made up of a single phase-locked loop (PLL)1. The axioms for the phase-locked loop 1 to generate high-frequency clock signals is on the basis of enabling the voltage-controlled oscillator (VCO) thereof to oscillate directly at a desired high frequency to output high-frequency clock signals. As is well known in the related art, the phase-locked loop 1 utilizes a negative feedback loop to generate an output oscillating clock signal in synchronization with the phase/frequency of the input clock signal, and an output voltage $V_o$ proportional to the variation of the input clock frequency. As illustrated in FIG. 1, the phase-locked loop 1 includes a phase/frequency detector 11, a charge pump 12, a low-pass filter 13, a voltage-controlled oscillator 14 and a frequency divider 15. The phase-locked loop 1 is configured to generate an output clock signal of a frequency $f_{VCO}$ being N times as the input clock frequency $f_i$, and the phase $\theta_{VCO}$ of the output clock signal $f_{VCO}$ is kept in synchronization with the phase $\theta_i$ of the input clock signal $f_i$. However, if the PLL 1 is configured to directly oscillate at a high frequency to output high-frequency clock signals, the voltage-controlled oscillator 14 will consume considerable power. And what is worse, because the power consumption of the VCO 14 is approximately proportional to the square of its operating frequency, as the operating frequency of the VCO 14 rises, the power consumption of the whole PLL 1 will grow up approximately in an exponential fashion. Therefore, the prior art of using a single PLL as a high-frequency clock generator is a quite power-consuming practice.

FIG. 2 shows the circuit configuration of another high-frequency clock generator according to the prior art. In FIG. 2, the clock generator 2 includes a PLL 21, a delayed lock loop (DLL) 22 and a logic circuit 23. The way of generating high-frequency clock signals by the clock generator of FIG. 2 depends on the PLL 21 to generate low-frequency clock signals $f_L$ and the DLL 22 to impose phase delays on the low-frequency clock signals $f_L$ to generate multiple low-frequency clock signals with a constant phase difference ($f_1$, $f_2$, . . . ). The logic circuit 23 receives the multiple low-frequency clock signals ($f_1$, $f_2$, . . . ) and outputs high-frequency clock signals $f_H$ in the control of the control signal $f_{CTRL}$. Comparing the high-frequency clock generator of FIG. 2 with that of FIG. 1, the circuit topology of the high-frequency clock generator of FIG. 2 though does not require the PLL 21 to work at a high frequency, a DLL 22 is additionally required and a control signal $f_{CTRL}$ is needed for switching the logic states of the logic circuit 23. Further, the relationships among the parameters of the control signal $f_{CTRL}$ and of the multiple low-frequency clock signals ($f_1$, $f_2$, . . . ), for example, skew, duty cycle, setup time, hold time, etc., are difficult to control, and the relationships among the clock signals in the DLL 22 are somewhat difficult to handle.

It is inclined to look for a high-frequency clock generator with low power consumption, which can receive a low-frequency input clock signal and outputs a high-frequency clock signal of a frequency being $N \times 2^n$ times as the input clock frequency.

SUMMARY OF THE INVENTION

In order to achieve a high-frequency clock generator with low power consumption and simple circuit design complexity, the present invention provides a clock generator comprising a phase-locked loop which generates a plurality of oscillating clock signals of a first frequency, each of the oscillating clock signals mutually has a constant phase difference averagely distributed over a clock cycle of 360 degrees; and a sampling circuit coupled to the phase-locked loop comprising at least one stage of sampler comprising at least one sampling unit, each of the sampling unit receives two oscillating clock signals of an input frequency and a selection signal of the input frequency and has a phase being an average of the phases of the two oscillating clock signals, and sampling the two oscillating clock signals according to the selection signal to generate a clock signal of a twofold frequency as the input frequency, for providing for the sampler of next stage as either an input signal or a selection signal for a sampling unit thereof, so as to generate a clock signal of a frequency being $2^n$ times as the first frequency, and where n is a number of stages of the sampler.

In a further aspect of the present invention, there is provided a method for generating a clock signal of a frequency being $2^n$ times as a first frequency, comprising the steps of:

(a) proving a plurality of clock signals of the first frequency by an electronic oscillator, each of the clock signals of the first frequency mutually has a constant phase difference distributed over a clock cycle of 360 degrees;

(b) providing a sampling circuit for receiving the clock signals of the first frequency, wherein the sampling circuit includes n stages of samplers, and each stage of samplers includes at least one sampling unit;

(c) selecting two of the clock signals of the first frequency as the input signals for a sampling unit of a first stage sampler, and selecting one of the clock signals of the first frequency having a phase being an average of the phases of the input signals as a selection signal for the sampling unit of the first stage sampler;

(d) sampling the input signals according to the selection signal to generate a clock signal of a twofold frequency as the input clock frequency;

(e) repeating step (d) until each sampling unit of the present stage sampler generates a clock signal of a twofold frequency, and transmitting the clock signals of a twofold frequency to the next stage sampler, wherein two of the clock signals of a twofold frequency are selected as the input signals for a sampling unit thereof, and one of the clock signals of a twofold frequency having a phase being an average of the phases of the two input signals is selected as a selection signal for the sampling unit;

(f) repeating step (e) until the sampler of the $n^{th}$ stage generates an output clock signal of a frequency being $2^n$ times as the first frequency.

Now the foregoing and other features and advantages of the present invention will be more clearly understood through the following descriptions with reference to the accompanying drawings, in which:

DETAILED DESCRIPTION OF THE PREFERRED EMBODIMENT

The high-frequency clock generator with low power consumption according to the present invention is based on the recognition that the phase-locked loop is an analog circuit comprising an oscillator, in which the phase/frequency of the output clock signals are kept in synchronization with those of the input reference signal. Consequently, the present invention suggests a high-frequency clock generator by using a phase-locked loop to drive the voltage-controlled oscillator (VCO) thereof to generate multiple oscillating clock signals with different phases (the oscillating clock signals generated by the VCO are low-frequency signals according to the present invention). These oscillating clock signals generated by the VCO are fed to a sampling circuit for carrying out sampling operation to these oscillating clock signals. The sampling circuit includes at least one stage of sampler, and each stage of sampler includes at least one sampling unit. In accordance with the present invention, two oscillating clock signals of the same frequency but with different phases are fed to a sampling unit of the first stage sampler as its input signals, and an oscillating clock signal of the same frequency as the two input signals and with a phase being an average of the phases of the two input signals are employed as its selection signal. By sampling the two input signals according to the logic high levels and the logic low levels of the selection signal, an output clock signal with a twofold frequency as the input signals can be obtained. The output clock signal can be directly outputted or fed to the sampler of the next stage to produce a clock signal of fourfold or higher-fold frequency.

Figure 1:
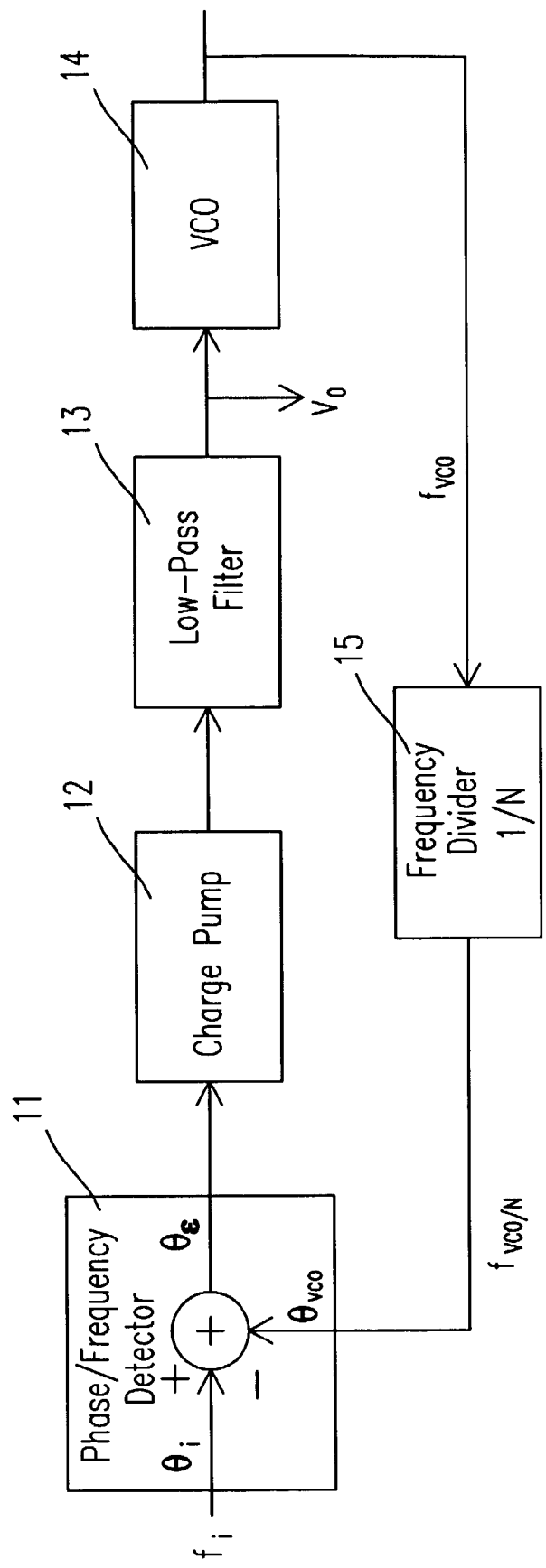
FIG. 1 is a circuitry depicting a high-frequency clock generator according to the prior art, in which the high frequency clock generator is implemented by a phase-locked loop.
Figure 2:
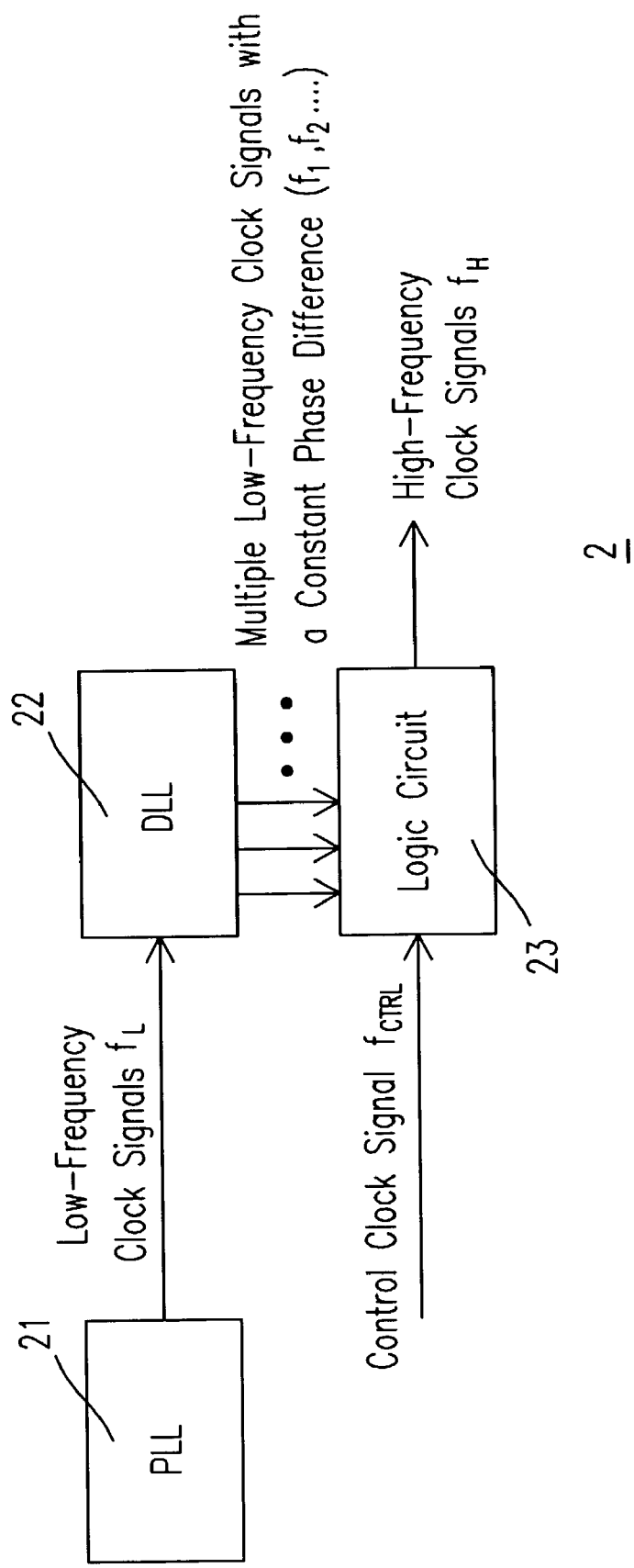
FIG. 2 is a block diagram showing another configuration of the high-frequency clock generator according to the prior art.
Figure 3:
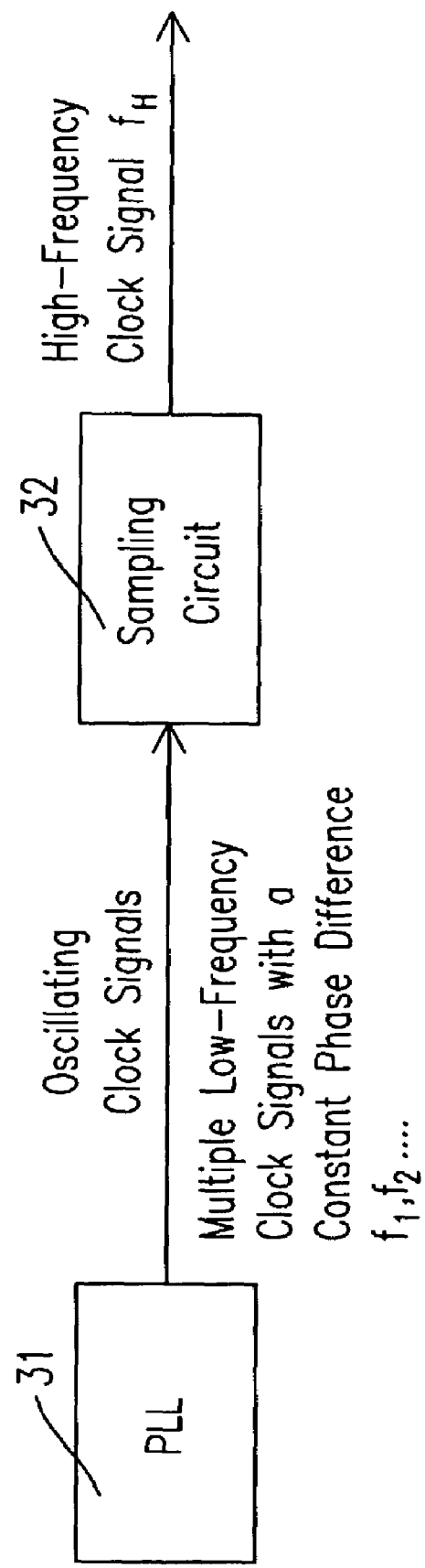
FIG. 3 is a plan view showing a block diagram of the clock generator according to a preferred embodiment of the present invention.

FIG. 3 depicts a block diagram of the clock generator according to a preferred embodiment of the present invention. In accordance with a preferred circuit configuration of the clock generator of the present invention, the clock generator of the present invention includes a single phase-locked loop (PLL) 31 and a sampling circuit 32 coupled thereto. The circuit configuration of the PLL 31 is shown in FIG. 1. As depicted in FIG. 1, the PLL is used to receive an input clock signal $f_i$, and the voltage-controlled oscillator 14 thereof is used to generate an output clock signal $f_{VCO}$ having a phase in synchronization with the phase of the input clock signal $f_i$. By way of the multistage differential ring structure of the voltage-controlled oscillator, multiple oscillating clock signals can be obtained at the output end of the VCO 14 and each oscillating clock signals mutually has a constant phase difference of $360°/2K$, where K is the number of stages in the differential ring structure of the VCO 14.

Figure 4:
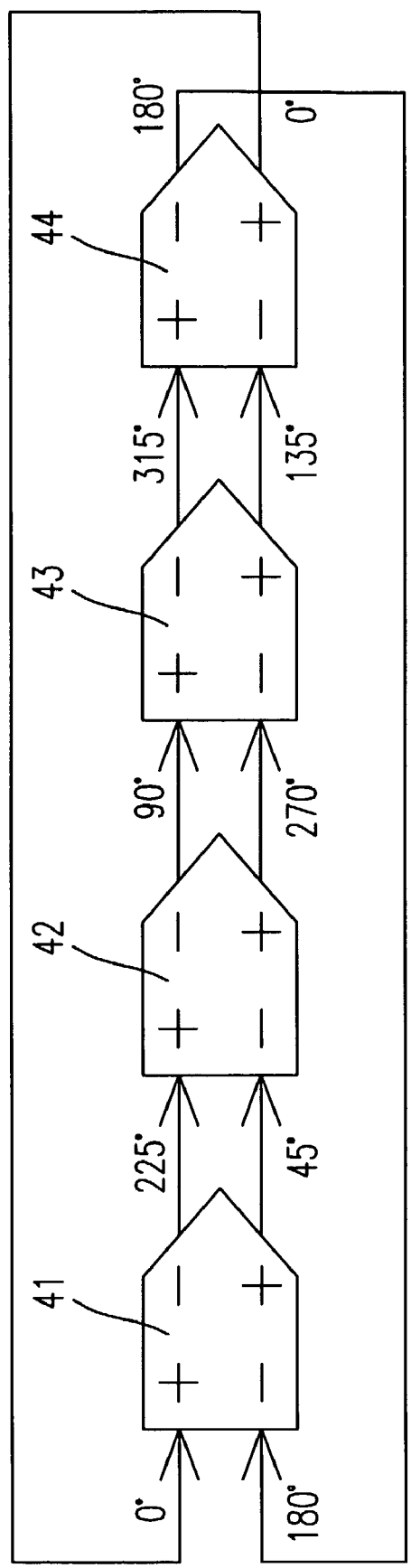
FIG. 4 shows a circuit configuration of a voltage-controlled oscillator in a phase-locked loop according to a preferred embodiment of the present invention.

FIG. 4 shows a circuit configuration of a voltage-controlled oscillator in a phase-locked loop according to a preferred embodiment of the present invention. In the preferred embodiment of FIG. 4, the VCO in the PLL is made up of a four-stage differential ring oscillator comprising unit delay cells 41, 42, 43, 44. The clock frequency and the phase delay control of the four-stage differential ring oscillator of FIG. 4 are achieved by varying the bias voltage of each stage, so as to determine the phase delay of each unit delay cell. As shown in FIG. 4, each unit delay cell provides two phase delay clocks of inverting phase relationship as input signals for the unit delay cell of the next stage. The unit delay cell 41 receives clocks of phases 0° and 180° and provides clocks of phases 225° and 45°; the unit delay cell 42 receives clocks of phases 225° and 45° and provides clocks of phases 90° and 270°; the unit delay cell 43 receives clocks of phases 90° and 270° and provides clocks of phases 315° and 135°; and the unit delay cell 44 receives clocks of phases 315° and 135° and provides clocks of phases 0° and 180° for feedback to the unit delay cell 41. In this preferred embodiment, the VCO in the PLL is designed as a four-stage differential ring oscillator as shown in FIG. 4, which is configured to provide a variety of oscillating clock signals each of which mutually has a phase difference of 45° averagely distributed over a clock cycle of 360°.

Referring to FIG. 3 again, for the purpose of transforming low-frequency clock signals into high-frequency clock signals, a sampling circuit 32 is coupled to the PLL 31 for receiving a variety of low-frequency oscillating clock signals with different phases provided by the four-stage differential ring oscillator of FIG. 4, and sampling the low-frequency oscillating clocks signals with different phases according to appropriate selection signals to obtain a clock signal of a frequency being $2^n$ times as the low-frequency oscillating clock signals. According to the present invention, the sampling circuit 32 is made up of a multistage sampler, and each stage of sampler at least includes a sampling unit. The circuit configuration and operation of the sampling circuit 32 will be described in detail through the following discussions.

FIGS. 5(A) to 5(D) and FIG. 6 shows the circuit composition of the sampling circuit and the clock signals with different phases in the sampling circuit according to a preferred embodiment of the present invention. In a preferred embodiment of the present invention, the sampling circuit includes four 2-to-1 multiplexers, and they are respectively shown in FIGS. 5(A) to 5(D). According to a preferred embodiment of the present invention, the clock generator of the present invention is used to generate a clock signal of fourfold frequency, and the VCO in the PLL is driven to generate a variety of oscillating clock signals with different phases as shown in FIG. 3. The multiplexers of FIG. 5(A), FIG. 5(B), FIG. 5(C) and FIG. 5(D) form a multistage sampling circuit, in which the multiplexers of FIG. 5(A), FIG. 5(B) and FIG. 5(C) form a first stage sampler, and the multiplexer of FIG. 5(D) forms a second stage sampler. The oscillating signals generated by the PLL as shown in FIG. 3 are provided for the multiplexers of the first stage sampler of the sampling circuit to carry out the sampling operation. With regard to the sampling technique used in the clock generator of the present invention, the first stage sampler employs two oscillating signals of inverting phase relationship (the phase difference is 180°) as the input signals of the multiplexer, and an oscillating signal having a phase being an average of the phases of the two input signals (the phase difference is 90°) as a selection signal for sampling. The multiplexer of FIG. 5 samples the two input signals according to the logic high level and the logic low level of the selection signal, by selecting one of the input signals according to the logic high level and the logic low level of the selection signal as its output, thereby generating an oscillating clock signal of a twofold frequency.

Figure 5A:
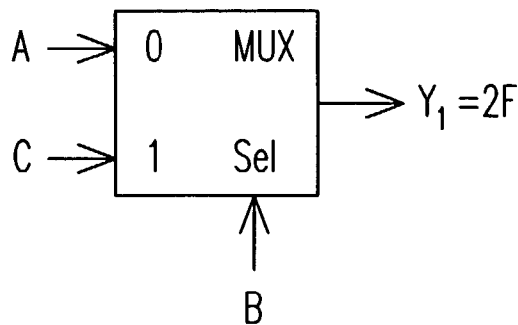
FIGS. 5(A) to 5(D) show the logic diagrams of each of the multiplexers in the multistage sampling circuit for generating a clock signal of a twofold frequency according to a preferred embodiment of the present invention.
Figure 5B:
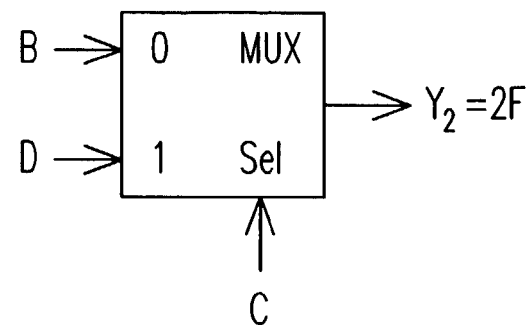
Figure 6:
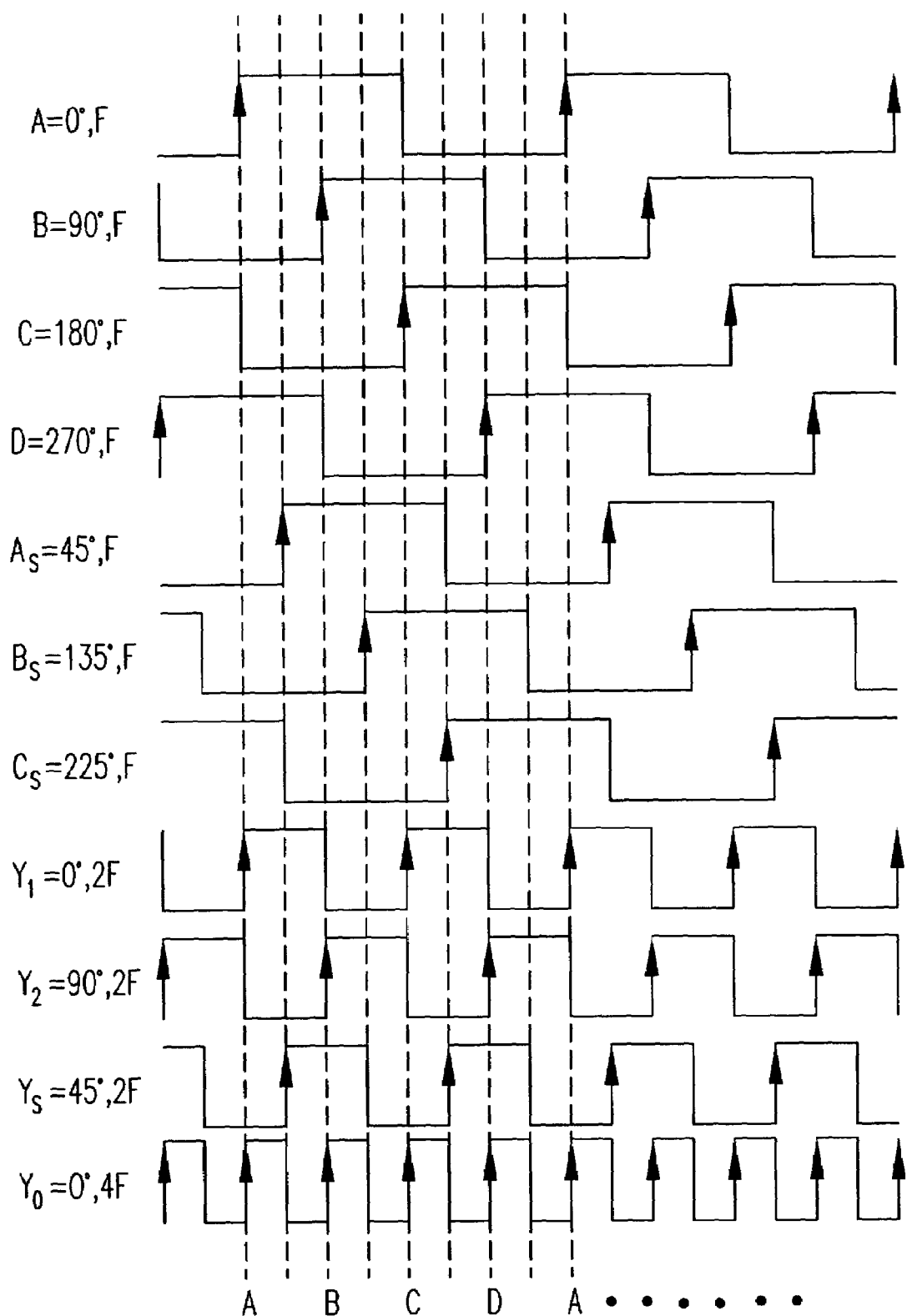
FIG. 6 exhibits a timing diagram for each of the clock signals appeared in the multiplexers of FIG. 5.

Please refer to FIG. 5(A) and FIG. 6. The multiplexer of FIG. 5(A) receives signal A (which is defined as the oscillating signal of phase 0° provided by the four-stage differential ring oscillator of FIG. 3) and signal C (which is defined as the oscillating signal of phase 180° provided by the four-stage differential ring oscillator of FIG. 3) as its input signals, and employs signal B (which is defined as the oscillating signal of phase 90° provided by the four-stage differential ring oscillator of FIG. 3) as its selection signal. According to the sampling theorem, when the signal B is at the logic low level (0), signal A will be selected as the output of the multiplexer; when the signal B at in the logic high level (1), signal C will be selected as the output of the multiplexer. By using the logic levels of the selection signal B to respectively select signals A and C as the output of the multiplexer, the output of the multiplexer will be signal $Y_1$, which is a clock signal of a twofold frequency with a phase of 0° (which is in the same phase with signal A).

The operation sequence and the relationships among all the clock signals of the other multiplexers can be deduced in an analogous way. Taking FIG. 5(B) as an example, the multiplexer of FIG. 5(B) receives signal B (which is defined as the oscillating signal of phase 90° provided by the four-stage differential ring oscillator of FIG. 3) and signal D (which is defined as the oscillating signal of phase 270° provided by the four-stage differential ring oscillator of FIG. 3) as its input signals, and employs signal C (which is defined as the oscillating signal of phase 180° provided by the four-stage differential ring oscillator of FIG. 3) as its selection signal. By using the logic high levels and logic low levels of the selection signal C to respectively select signals B and D as the output of the multiplexer, the output of the multiplexer will be signal $Y_2$, which is a clock signal of a twofold frequency with a phase of 90° (which is in the same phase with signal B). The multiplexer of FIG. 5(C) receives signal $A_S$ (which is defined as the oscillating signal of phase 45° provided by the four-stage differential ring oscillator of FIG. 3) and signal $C_S$ (which is defined as the oscillating signal of phase 225° provided by the four-stage differential ring oscillator of FIG. 3) as its input signals, and employs signal $B_S$ (which is defined as the oscillating signal of phase 135° provided by the four-stage differential ring oscillator of FIG. 3) as its selection signal. By using the logic high levels and logic low levels of the selection signal $B_S$ to respectively select signals $A_S$ and $C_S$ as the output of the multiplexer, the output of the multiplexer will be signal $Y_S$, which is a clock signal of a twofold frequency with a phase of 45° (which is in the same phase with signal $A_S$).

Figure 5C:
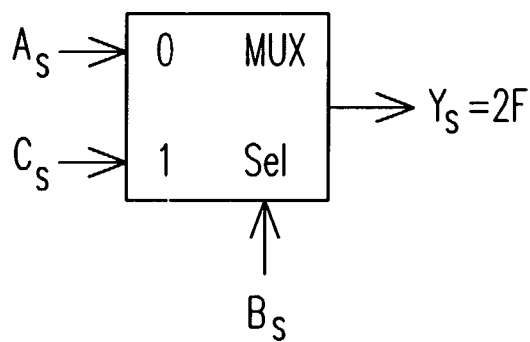
Figure 5D:
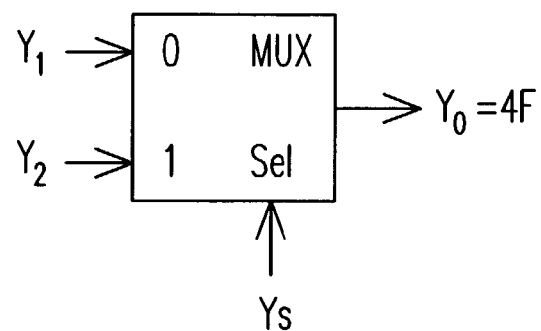

In FIG. 5(D), the multiplexer of FIG. 5(C) receives signal $Y_1$ and signal $Y_2$ as its input signals, and employs signal $Y_S$ as its selection signal. By using the logic high levels and logic low levels of the selection signal $Y_S$ to respectively select signals $Y_1$ and $Y_2$ as the output of the multiplexer, the output of the multiplexer will be signal $Y_O$, which is a clock signal of a fourfold frequency with a phase of 0° (which is in the same phase with signal $Y_1$). It becomes apparent in virtue of the foregoing discussions that by taking two oscillating signals of the same frequency but with different phases as the input signals of a 2-to-1 multiplexers, and taking an oscillating signal of the same frequency as the input signals and with a phase being an average of the phases of the input signals as the selection signals of the 2-to-1 multiplexer, an clock signal of a twofold frequency can be obtained at the output end of the 2-to-1 multiplexer by selecting one of the input signals according to the logic levels of the selection signals as the output of the 2-to-1 multiplexer. If it is desired to obtain a clock signal of a higher-fold frequency, the number of the stages of the voltage-controlled oscillators has to be expanded to generate more oscillating clock signals with different phases, and a multistage sampler comprising 2-to-1 multiplexers has to be cascaded with the sampling circuit comprised of the 2-to-1 multiplexers of FIGS. 5(A) to 5(D).

It is worthwhile to note that the foregoing embodiment is used to illustrate the circuit configuration of the sampling circuit for generating clock signals of a twofold frequency and a fourfold frequency. In accordance with the present invention, the circuit configuration of the sampling circuit for generating a clock signal of $2^n$-fold frequency (wherein n is a positive integer number) can be inferred by a person having ordinary skill in the art from the above discussions. For example, if it is desired to generate a clock signal of a twofold frequency, a multiplexer is needed to be coupled to a PLL as a first stage sampler for receiving two oscillating signals with different phases. If it is desired to generate a clock signal of a fourfold frequency, four multiplexers are needed to be coupled to a PLL, in which three multiplexers form a first stage sampler for generating three clock signals of a twofold frequency but with different phases, and the remained multiplexer forms a second stage sampler for receiving two of the three clock signals of the twofold frequency but with different phases as its input signals and the remained clock signal of the twofold frequency but with a phase being an average of the phases of the two input signals as its selection signal. A fourfold frequency clock signal can be obtained at the output end of the second stage sampler by performing a sampling operation to the two inputs signals of the second stage sampler according to the selection signal.

It is to be known from the above discussions that if we hypothesize that m denotes the amount of the two-to-one multiplexers in the sampling circuit and the desired output frequency is $2^n$ times as the input clock frequency, a general formula for calculating the amount of two-to-one multiplexers required by the sampling circuit can be deduced so that the amount of the two-to-one multiplexers in the sampling circuit can be resolved.

When n=1, the sampling circuit comprises a single stage sampler comprising a two-to-one multiplexer, and where m=1.

When n=2, the sampling circuit comprises a two stage sampler, in which the amount of the multiplexers in the first stage sampler is 3 and the amount of the multiplexers in the second stage sampler is 1, and where $m=3\times1+1=3^1+3^0=4$.

When n=3, the sampling circuit comprises a three stage sampler, in which the amount of the multiplexers in the first stage sampler is 3×3, the amount of the multiplexers in the second stage sampler is 3×1 and the amount of the multiplexers in the third stage sampler is 1, and where m=3×3+3×1+1=3²+3¹+3⁰=13.

When n=4, the sampling circuit comprises a four stage sampler, in which the amount of the multiplexers in the first stage sampler is 3×3×3, the amount of the multiplexers in the second stage sampler is 3×3, the amount of the multiplexers in the third stage sampler is 3×1 and the amount of the multiplexers in the fourth stage sampler is 1, and where m=3×3×3+3×3+3×1+1=3³+3²+3¹+3⁰=40.

On the basis of the above deductions, a descriptive formula for evaluating the amount of the multiplexers in the sampling circuit can be derived from the following inference. Hypothesize that the sampling circuit comprises n stage sampler, in which the amount of the multiplexers in the first stage sampler is $3^{n-1}$, the amount of the multiplexers in the second stage sampler is $3^{n-2}$, the amount of the multiplexers in the third stage sampler is $3^{n-3}$, . . . , and the amount of the multiplexers in the $n^{th}$ stage sampler is $3^0$, this results in:

$$m = 3^{n-1} + 3^{n-2} + 3^{n-3} + \ldots + 3^0 = \frac{3^n - 1}{2}$$

To sum up, it can be readily understood from the above discussions that the high-frequency clock generator of the present invention is peculiarized by that only a single phase-locked loop is required to provide multiple low-frequency clock signals, with a serially-connected multi-stage sampling circuit coupled thereto for sampling the low-frequency clock signals to generate high-frequency clock signals. Comparing to the prior high-frequency clock generator, the high-frequency clock generator according to the present invention does not need a DLL to generate clock signals with a variety of phases, and does not need to enable the PLL to work at a high frequency so as to save power consumption. Besides, because these low-frequency clock signals are all originated from the same voltage-controlled oscillator in the phase-locked loop, the high-frequency clock generator according to the present invention does not require any external control clock source. In accordance with a preferred embodiment of the present invention, only a single PLL working at a quarter of the desired output frequency is required. On the other hand, the circuit topology of the high-frequency clock generator according to the present invention can be applied to generate a clock signal of a $2^n$-fold frequency as desired (wherein n is a positive integer number) by cascading samplers of more stages to constitute a multistage cascaded sampling circuit. Further, because the high-frequency clock generator makes use of the logic high levels and logic low levels of the selection signal to sample the low-frequency oscillating clock signals to generate high-frequency clock signals, the duty cycle of the output oscillating clock signals of the VCO is not quite sensitive. Also, because the two input signals for use in the sampling operation are derived from the VCO, the voltage jitter can be controlled as low as possible while the circuit layout is advisable, and the average frequency of the output clock signal as a long time elapsed can be considerably stable. The present invention not only can simplify the circuit design complexity of the high-frequency clock generator, but can save a great deal of power consumption and attain a simple and power-saving high-frequency synthesis clock generator.

While the present invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claim is:

1. A clock generator comprising:
   a phase-locked loop which generates a plurality of oscillating clock signals of a first frequency, each of which mutually has a constant phase difference averagely distributed over a clock cycle of 360 degrees; and
   a sampling circuit coupled to said phase-locked loop and comprising at lease one stage of sampler comprising at least one sampling unit, each of said sampling unit receives two oscillating clock signals of an input frequency and one selection signal of said input frequency with a phase being an average of the phases of said two oscillating clock signals of said input frequency, and samples said two oscillating clock signals of said input frequency according to said selection signal to generate a clock signal of a frequency as twice as said input frequency, for providing for the sampler of next stage as either an input signal or a selection signal for a sampling unit thereof, so as to generate a clock signal of a frequency being $2^n$ times as said first frequency, and where n is a number of stages of said sampler.

2. The clock generator according to claim 1 wherein said phase-locked loop comprises at least one voltage-controlled oscillator.

3. The clock generator according to claim 2 wherein said voltage-controlled oscillator is a multistage differential ring oscillator comprising a plurality of delay unit cells.

4. The clock generator according to claim 1 wherein said sampling unit comprises a two-to-one multiplexer.

5. The clock generator according to claim 1 wherein said sampling circuit comprises m sampling unit, and where m is $$\frac{3^n - 1}{2}.$$

6. The clock generator according to claim 1 wherein said sampling unit selects one of said two oscillating clock signals of said input frequency according to a logic high level and a logic low level of said selection signal to output a clock signal of a frequency being twice of said input frequency.

7. A clock generator comprising:
   a clock supplying apparatus for providing a plurality of clock signals each of which mutually has a first frequency and a different phase difference; and
   a sampling circuit coupled to said clock supplying apparatus and comprising at least one stage of sampler comprising at least one sampling unit;
   wherein each of said sampling unit receives two clock signals of an input frequency and one selection signal of said input frequency with a phase being an average of the phases of said two clock signals of said input frequency, and samples said two clock signals of said input frequency according to said selection signal to generate a clock signal of a frequency as twice as said input frequency, for providing for the sampler of next stage as either an input signal or a selection signal for a sampling unit thereof, so as to generate a clock signal of a frequency being $2^n$ times as said first frequency, and where n is a number of stages of said sampler.

8. The clock generator according to claim 7 wherein said clock supplying apparatus is a phase locked loop.

9. The clock generator according to claim 8 wherein said phase locked loop comprises a voltage-controlled oscillator for providing said plurality of clock signals.

10. The clock generator according to claim 9 wherein said voltage-controlled oscillator is a multistage differential ring oscillator comprising a plurality of delay unit cells.

11. The clock generator according to claim 7 wherein said sampling unit comprises a two-to-one multiplexer.

12. The clock generator according to claim 7 wherein said sampling circuit comprises m sampling unit, and where m is $$\frac{3^n - 1}{2}.$$

13. The clock generator according to claim 7 wherein said sampling unit selects one of said two clock signals of said input frequency according to a logic high level and a logic low level of said selection signal to output a clock signal with a frequency being twice of said input frequency.

14. A method for generating a clock signal of a frequency being $2^n$ times as a first frequency, comprising the steps of:
  (a) providing a plurality of oscillating clock signals of said first frequency by an electronic oscillating device, wherein each of said oscillating clock signals mutually has a constant phase difference averagely distributed over a clock cycle of 360 degrees;
  (b) providing a sampling circuit comprising n stages of samplers each of which comprises at least one sampling unit for receiving said oscillating clock signals of said first frequency;
  (c) selecting two of said oscillating clock signals of said first frequency as input signals for a sampling unit of a first stage sampler, and selecting one of said oscillating clock signals of said first frequency with a phase being an average of the phases of said input signals as a selection signal for said sampling unit of said first stage sampler;
  (d) sampling said input signals according to said selection signal to generate a clock signal of a twofold frequency as said input signals;
  (e) repeating step (d) until each sampling unit generates a clock signal of a twofold frequency as said input signals, and transmitting said clock signals of a twofold frequency to the next stage sampler, wherein two of said clock signals of a twofold frequency are selected as input signals for a sampling unit thereof, and one of said clock signals of a twofold frequency with a phase being an average of the phases of said input signals is selected as a selection signal for said sampling unit;
  (f) repeating step (e) until a $n^{th}$ stage sampler generates a clock signal of a frequency being $2^n$ times as said first frequency.

15. The method of claim 14 wherein at said step (d), said clock signal of a twofold frequency is generated by selecting one of said input signals according to a logic high level and a logic low level of said selection signal to output.

* * * * *